United States Patent [19]

Seabaugh

[11] Patent Number: 5,767,526

[45] Date of Patent: Jun. 16, 1998

[54] BIPOLAR RESONANT TUNNELING TRANSISTOR FREQUENCY MULTIPLIER

[75] Inventor: Alan C. Seabaugh, Richardson, Tex.

[73] Assignee: Texas Instruments Incorporated, Dallas, Tex.

[21] Appl. No.: 782,014

[22] Filed: Jan. 7, 1997

[51] Int. Cl.$^6$ .................. H01L 29/06; H01L 31/0238; H01L 31/0336

[52] U.S. Cl. .................. 257/17; 257/23; 257/25; 257/197; 257/198

[58] Field of Search .................. 257/25, 197, 198, 257/23, 17

[56] References Cited

U.S. PATENT DOCUMENTS

| | | |
|---|---|---|
| 4,902,912 | 2/1990 | Capasso et al. .................. 327/568 |
| 5,130,763 | 7/1992 | Delhaye et al. .................. 257/192 |
| 5,283,448 | 2/1994 | Baykartaroglu .................. 257/194 |
| 5,554,860 | 9/1996 | Seabaugh .................. 257/25 |

*Primary Examiner*—William Mintel
*Attorney, Agent, or Firm*—Christopher L. Maginniss; W. James Brady, III; Richard L. Donaldson

[57] ABSTRACT

A solid-state frequency multiplier circuit (10) is provided which includes a bipolar quantum-well resonant tunneling transistor (12), a resistive load (14), and an A.C. output coupling capacitor (16), all which may be formed in a single integrated circuit or as discrete components. The value of the resistive load (14) determines the frequency multiplication factor of the circuit (10), and can produce frequencies in a range from about 2 GHz to over 20 GHz. A different embodiment of the present invention provides a frequency multiplication circuit (20) which generates a sinusoidal output waveform, without using an output A.C. coupling capacitor.

9 Claims, 1 Drawing Sheet

1

BIPOLAR RESONANT TUNNELING TRANSISTOR FREQUENCY MULTIPLIER

TECHNICAL FIELD OF THE INVENTION

The present invention relates generally to semiconductor devices, and more particularly, to a bipolar quantum-well resonant tunneling transistor circuit for use as a frequency multiplier.

BACKGROUND OF THE INVENTION

Microwave frequency multiplication in frequency bands from S-band (2–4 GHz) to W-band (75–110 GHz) is used in such applications as high frequency communications, radar, smart munitions, and active missile guidance. Microwave frequency multiplication may also be used in other applications, such as cordless phones and garage door openers. For example, frequency multipliers are used to generate local oscillator signals for communications systems operating in numerous bands, such as 3.7–4.2 GHz for satellite TV, 12–14 GHz for direct broadcast satellite communications, 30–40 GHz for broadcast cable communications, and radar, smart munitions, and active missile guidance telemetry in the X-band (5.2–10.9 GHz) through the W-band (75–110 GHz). A critical systems performance parameter for a microwave frequency multiplier is the amount of phase noise the multiplier adds to the local oscillator signal. Decreasing the amount of phase noise a multiplier adds to a local oscillator signal, thereby increases the system's signal-to-noise ratio and, ultimately, improves system performance.

Previously developed, solid-state microwave frequency multipliers have used a quartz surface acoustic wave (SAW) resonator, which oscillates at about 1 GHz. The SAW multiplier has the lowest phase noise of the solid-state devices operating in this frequency band, but it has been limited in frequency to below 2 GHz because of fabrication limitations. Consequently, in order to obtain relatively high performance with low phase noise in oscillators operating at frequencies above 1 GHz, a SAW oscillator typically has been used in combination with a step recovery diode to provide the desired multiplication. However, a step recovery diode only provides a multiplication factor of 2. Therefore, a chain of step recovery diodes has been used to provide higher multiplication factors. For example, a chain of four step recovery diodes provides a multiplication factor of 16.

Unfortunately, a step recovery diode chain multiplier generates undesirable harmonics, which must be filtered out between each stage in the chain. Also, the signal between each stage must be amplified, in order to compensate for the conversion loss of each diode. Consequently, a SAW/step recovery diode multiplier requires additional circuitry for filtering and amplification, which creates a relatively large and complicated solid-state circuit that is exceedingly costly to produce.

SUMMARY OF THE INVENTION

Accordingly, there is a need for a solid-state microwave frequency multiplier circuit that is relatively small, not as complex and costly to produce as previous multipliers, and has low phase noise at all frequencies.

In accordance with the present invention, a solid-state frequency multiplier circuit is provided which includes a bipolar quantum-well resonant tunneling transistor, a resistive load, and an A.C. output coupling capacitor, all which may be formed in a single integrated circuit or as discrete components. The value of the resistive load determines the frequency multiplication factor of the circuit, and can produce frequencies in a range from about 2 GHz to over 20 GHz. A different embodiment of the present invention provides frequency multiplication in a sinusoidal output waveform, without using an output A.C. coupling capacitor.

An important technical advantage of the present invention is that very low phase noise is produced.

Another important technical advantage of the present invention is that frequency multiplication is provided at microwave frequencies with a single active device, which significantly decreases the size, complexity and cost of the frequency multiplier circuit.

Yet another important technical advantage of the present invention is that a microwave frequency multiplier circuit can be provided in a single integrated circuit, which can significantly decrease the size, complexity and cost of the frequency multiplier circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–5 of the drawings, like numerals being used for like and corresponding parts of the various drawings.

Figure 1:
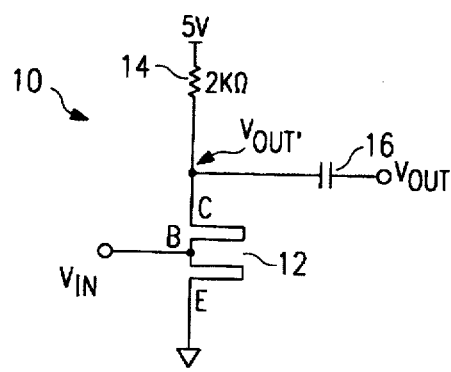
FIG. 1 is an electrical schematic diagram of a bipolar resonant tunneling transistor frequency multiplier circuit, which illustrates a preferred embodiment of the present invention.

FIG. 1 is an electrical schematic diagram of a bipolar resonant tunneling transistor frequency multiplier circuit 10, which illustrates a preferred embodiment of the present invention. Multiplier circuit 10 is preferably a monolithic integrated circuit, but it can also be fabricated as a number of discrete components. Referring to FIG. 1, a three terminal bipolar resonant tunneling transistor 12 is shown. Transistor 12 is preferably a three terminal bipolar quantum-well resonant tunneling transistor (BiQuaRTT) developed and produced by Texas Instruments Incorporated. A load resistor 14 is connected to a supply voltage (e.g., 5V) for the circuit and the collector terminal of transistor 12. Preferably, for the embodiment shown in FIG. 1, the value of load resistor 14 is 2KΩ. In this embodiment, a resistor is shown for load resistor 14. However, any appropriate active device having a linear volt-current characteristic can be used for load resistor 14, such as, for example, a resonant tunneling transistor. An input voltage can be coupled to the base terminal of transistor 12 through a terminal connection $V_{IN}$. The output voltage of circuit 10 can be coupled from the collector terminal of the transistor, through a coupling capacitor 16, to an output terminal connection $V_{OUT}$. The emitter terminal of transistor 12 can be connected to the circuit "ground".

Figure 2:
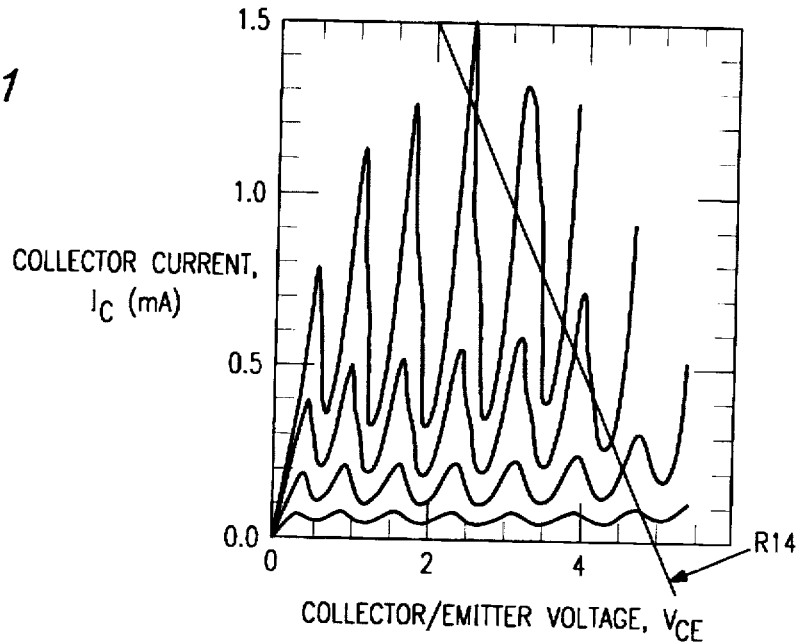
FIG. 2 is a graph that illustrates the operation of the transistor and frequency multiplier circuit shown in FIG. 1.

FIG. 2 is a graph that illustrates the operation of transistor 12 and frequency multiplier circuit 10 shown in FIG. 1. Specifically, the graph in FIG. 2 shows collector-to-emitter voltage, $V_{CE}$, versus collector current, $I_C$, operating characteristics of transistor 12. For the embodiment shown in FIG. 1 and illustrated by FIG. 2, the emitter area of transistor 12 is preferably about 4×20 μm², the base current is preferably about 50 μA/step, and the operating temperature is preferably about 77° K. However, although the characteristics shown in FIG. 2 are for the preferred embodiment shown in FIG. 1, the above-described values are provided for illustrative purposes only and not intended to limit the scope of the present invention. For example, transistor 12 can be fabricated with other emitter areas, and operated with other base currents and at other temperatures than those illustrated in FIG. 2.

A value of load resistor 12 can be selected to determine the frequency multiplication factor of circuit 10. For example, to select a multiplication factor of eight for this embodiment, the resistance value of the load can be determined by the slope of line R14 in FIG. 2, which has been selected to traverse four $I_C$ peaks, as a function of $V_{CE}$. The slope of line R14 is equal to about (5V−2V)/1.5 mA, or 2 KΩ. A.C. coupling (via capacitor 16) the output voltage, $V_{OUT}'$, creates a sinusoidal output voltage, at $V_{OUT}$, with a frequency equal to twice the number of peaks traversed, as determined by the amplitude of the base voltage swing (e.g., $V_{IN}$ or $V_{BE}$). Consequently, for the four peaks traversed in FIG. 2, the multiplication factor of frequency multiplier circuit 10 in FIG. 1 (at $V_{OUT}$) is eight. Multiplication factors of greater than 20 can be realized with a BiQuaRRT device used for transistor 12, in a frequency multiplier circuit such as circuit 10.

Referring to FIGS. 1 and 2 for the operation of frequency multiplier circuit 10, an alternating current signal applied to the base terminal (via terminal $V_{IN}$) of transistor 12 causes the collector current, $I_C$, to step along the load line, R14. The steps shown in the output voltage waveform, at $V_{OUT}'$, occur because of the multistable switching that occurs along the load line passing across the negative differential resistance regions of the I-V (current-voltage) curves. The output signal, $V_{OUT}'$, of transistor 12 is preferably differentiated by capacitor 16 and A.C. coupled to the output terminal, $V_{OUT}$. As shown by FIG. 2, the present frequency multiplier circuit 10 advantageously provides conversion gain, in contrast to previously developed diode and transistor frequency multipliers. Notably, although the characteristics shown in FIG. 2 can be produced at relatively low-temperatures (e.g., 77° K.), circuit 10 can also be operated at room temperatures (with slightly lower peak-to-valley collector current ratios than those shown in FIG. 2).

Figure 3:
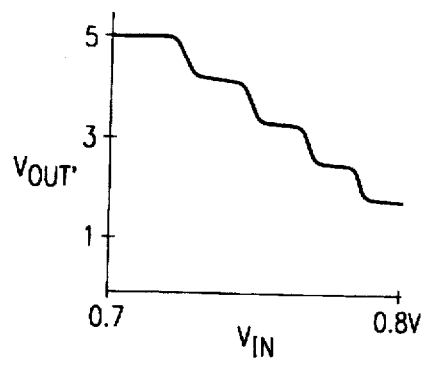
FIG. 3 is a graph that illustrates output voltages versus input voltages for the transistor shown in FIG. 1.

FIG. 3 is a graph that illustrates the transfer (output voltage versus input voltage) characteristics for the bipolar resonant tunneling transistor 12 shown in FIG. 1. FIG. 3 illustrates that the output voltage (at $V_{OUT}$) of transistor 12 varies sinusoidally in response to a ramp input voltage (at $V_{IN}$).

Figure 4:
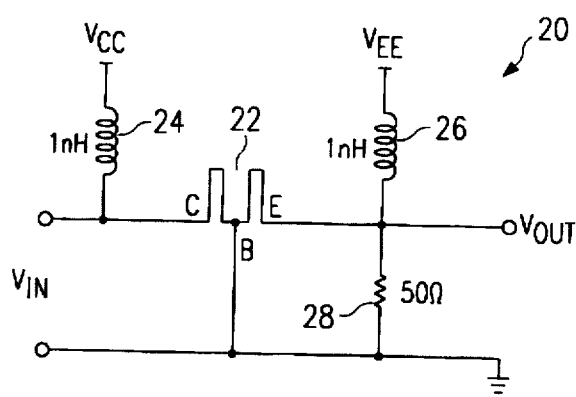
FIG. 4 is an electrical schematic diagram of a bipolar resonant tunneling transistor frequency multiplier circuit, which illustrates a second embodiment of the present invention.

FIG. 4 is an electrical schematic diagram of a bipolar resonant tunneling transistor frequency multiplier circuit 20, which illustrates a second embodiment of the present invention. Multiplier circuit 20 is preferably a monolithic integrated circuit, but it can also be fabricated as discrete components. Referring to FIG. 4, a three terminal bipolar resonant tunneling transistor 22 is shown. For this embodiment, transistor 22 is preferably a BiQuaRTT device developed and produced by Texas Instruments Incorporated. Transistor 22 can be connected in a common base configuration in multiplier circuit 20. An input voltage signal can be coupled to a collector terminal of transistor 22 via an input terminal connection, $V_{IN}$. One terminal of an inductor 24 can be connected to the collector terminal of transistor 22, and the second terminal of inductor 24 can be connected to a supply voltage, $V_{CC}$ (e.g., 1 to 2 volts). The base terminal of transistor 22 can be connected to circuit "ground". The emitter terminal of transistor 22 can be connected to one terminal of a second inductor 26, one terminal of a resistor 28, and an output terminal, $V_{OUT}$, of multiplier circuit 20. The second terminal of inductor 26 can be connected to a second supply voltage, $V_{EE}$, and the second terminal of resistor 28 can be connected to circuit "ground". In the embodiment shown in FIG. 4, the value of each of inductors 24 and 26 is preferably 1 nH, and the value of resistor 28 is preferably 50Ω. Again, it should be understood that other values of resistance and inductance may be substituted for the values shown in FIG. 4, which have been provided as shown to illustrate the structure and operation of this embodiment.

Figure 5:
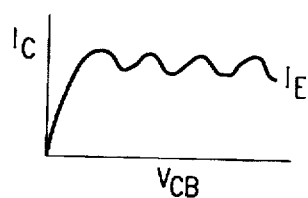
FIG. 5 is a graph that illustrates a sinusoidal characteristic of the current flowing through the bipolar resonant tunneling transistor shown in FIG. 4, as a function of the input voltage.

FIG. 5 is a graph that illustrates a sinusoidal characteristic of the current, $I_C$, flowing through the bipolar resonant tunneling transistor 22 shown in FIG. 4, as a function of the input voltage applied at $V_{IN}$ (i.e., $V_{CB}$). Referring to FIGS. 4 and 5 for a description of the operation of frequency multiplier circuit 20, the value of the supply voltage, $V_{EE}$, is a predetermined value, which can be selected (e.g., −0.75V) to bias the current flowing through transistor 22 to a D.C. level, $I_E$ (e.g., the D.C. level of current flowing through the emitter). An A.C. voltage signal applied at the input terminal, $V_{IN}$, varies the transmission resonances of the base/collector junction of transistor 22 to modulate the collector current, $I_C$. The voltage at the output terminal, $V_{OUT}$, is an A.C. signal oscillating at a frequency of n x (the magnitude of the input signal, $V_{IN}$ or $V_{CB}$). As illustrated by FIG. 4, in contrast to previously developed diode and transistor frequency multipliers, the present solid state, frequency multiplier circuit 20 advantageously provides a sinusoidal output signal, at $V_{OUT}$, without using an output A.C. coupling capacitor. Consequently, the size of multiplier circuit 20 can be significantly reduced.

Although the present invention and its advantages have been described in detail, it should be understood that various changes, substitutions, and alterations can be made herein without departing from the spirit and scope of the invention as defined by the appended claims.

What is claimed is:

1. A solid-state frequency multiplier, comprising:
   a bipolar quantum-well resonant tunneling transistor;
   a resistive device connected to an output terminal of said bipolar quantum-well resonant tunneling transistor, said resistive device having a linear volt-current characteristic selected to determine a frequency multiplication factor for said solid-state frequency multiplier; and
   a capacitive device coupled to said output terminal.

2. The solid-state frequency multiplier of claim 1, wherein said resistive device comprises a load resistor, a value of said load resistor selected to determine said frequency multiplication factor for said solid-state frequency multiplier.

3. The solid-state frequency multiplier of claim 1, wherein said resistive device comprises an active device having said linear volt-current characteristic.

4. The solid-state frequency multiplier of claim 1, wherein said resistive device comprises a resonant tunneling transistor.

5. The solid-state frequency multiplier of claim 1, wherein said capacitive device comprises an A.C. coupling capacitor.

6. The solid-state frequency multiplier of claim 1, wherein said bipolar quantum-well resonant tunneling transistor and at least one of said resistive device and said capacitive device comprises a single integrated circuit.

7. A solid-state frequency multiplier, comprising:

a bipolar quantum-well resonant tunneling transistor;

a first inductive device connected to an input terminal of said bipolar quantum-well resonant tunneling transistor; and a second inductive device connected to an output terminal of said bipolar quantum-well resonant tunneling transistor.

8. The solid-state frequency multiplier of claim 7, wherein said second inductive device is operable to couple said output terminal of said bipolar quantum-well resonant tunneling transistor to a voltage, a value of said voltage selected to bias a current flow through said transistor.

9. The solid-state frequency multiplier of claim 7, wherein said bipolar quantum-well resonant tunneling transistor and at least one of said first inductive device and said second inductive device comprises a single integrated circuit.

* * * * *